United States Patent
Bodano et al.

(10) Patent No.: US 8,981,820 B2
(45) Date of Patent: Mar. 17, 2015

(54) DRIVER CIRCUIT

(71) Applicant: Infineon Technologies AG, Neubiberg (DE)

(72) Inventors: Emanuele Bodano, Villach (AT); Maria Giovanna Lagioia, Villach (AT); Joachim Pichler, Landskron (AT); Volha Subotskaya, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/903,257

(22) Filed: May 28, 2013

(65) Prior Publication Data

US 2013/0321035 A1    Dec. 5, 2013

(30) Foreign Application Priority Data

May 29, 2012  (DE) .......................... 10 2012 104 590

(51) Int. Cl.
 *H03K 3/00* (2006.01)
 *H03K 17/16* (2006.01)
(52) U.S. Cl.
 CPC .................................. *H03K 17/165* (2013.01)
 USPC .......................................... 327/109; 327/112

(58) Field of Classification Search
 USPC .................................................. 327/108–112
 See application file for complete search history.

(56) References Cited

U.S. PATENT DOCUMENTS

| | | | |
|---|---|---|---|
| 2,967,991 A | 1/1961 | Deuitch | |
| 6,661,250 B2 * | 12/2003 | Kim et al. | 326/30 |
| 8,508,259 B2 * | 8/2013 | Joos et al. | 327/108 |
| 2005/0030068 A1 * | 2/2005 | Dickman | 327/112 |
| 2005/0168206 A1 | 8/2005 | Nadd | |
| 2006/0132194 A1 | 6/2006 | Harriman | |
| 2007/0103133 A1 * | 5/2007 | Joos et al. | 323/282 |
| 2012/0126859 A1 * | 5/2012 | Kawamoto et al. | 327/108 |
| 2012/0223746 A1 * | 9/2012 | Pham | 327/109 |
| 2013/0181749 A1 * | 7/2013 | Hamanaka | 327/109 |

OTHER PUBLICATIONS

Gray, Hurst, Lewis, Meyer: "Analysis and Design of Analog Integrated Circuits." Fourth Edition. New York, NY, USA : John Wiley & Sons, Inc., 2001. p. 596.—ISBN 0-471-32168-0.

* cited by examiner

*Primary Examiner* — Ryan Jager
(74) *Attorney, Agent, or Firm* — Eschweiler & Associates, LLC

(57) ABSTRACT

Devices and methods are provided in which a driver is supplied via a first current path and a second current path which can comprise a switching element.

12 Claims, 2 Drawing Sheets

DRIVER CIRCUIT

REFERENCE TO RELATED APPLICATION

This application claims priority to German application number 10 2012 1045 90.9 filed on May 29, 2012.

FIELD

The present disclosure relates to a driver circuit with corresponding current supply, for example a driver circuit which is usable for driving a supply voltage switching element.

BACKGROUND

In many applications, for example automotive applications, it is desirable to rapidly switch a switch, for example a switch arranged between a load and a voltage supply. This can lead to high peak currents, which can in turn lead to fluctuations in the voltage supply and thus to disturbances of other circuit sections coupled to the voltage supply, for example circuit sections of an integrated circuit. Such switches are often driven by a driver which switches the switch in a manner dependent on a control signal.

Therefore, there is a need for driver circuits which can drive such switches without thereby disturbing for example a stability of a supply voltage in an integrated circuit containing the driver circuit.

SUMMARY

A circuit comprises a driver having an input, an output, a first supply terminal and a second supply terminal. The circuit further comprises a first current path between a first supply voltage potential and the first supply terminal of the driver and a second current path between the first supply terminal of the driver and the first supply voltage potential, wherein the second current path comprises a switching element configured to selectively activate and deactivate the second current path, and wherein the second supply terminal of the driver is coupled to a second supply voltage potential. The circuit further comprises a controller configured to drive the switching element to activate the second current path if a current through the driver reaches a predefined threshold value.

A method comprises supplying a driver via a first current path, and selectively activating a second current path for supplying the driver if a current through the driver exceeds a predefined threshold current.

In some example embodiments, a current supply of a driver can be stabilized by a use of a first current path and of a second current path. In other example embodiments, a voltage at a supply input of the driver can additionally be stabilized by a regulation.

BRIEF DESCRIPTION OF THE DRAWINGS

Further example embodiments of the disclosure are explained in greater detail below with reference to the accompanying drawings, in which.

DETAILED DESCRIPTION

Example embodiments of the disclosure are explained in detail below with reference to the accompanying drawings. It should be noted that the features of different example embodiments can be combined with one another, unless indicated to the contrary. On the other hand, a description of an example embodiment with a large number of features should not be interpreted to the effect that all these features are necessary for implementing the disclosure, since other example embodiments can have fewer features and/or alternative features.

It should additionally be noted that connections described as wired in the example embodiments can also be implemented as wireless connections, and vice versa, unless indicated otherwise.

It should also be noted that any direct connection between two elements, i.e. a connection without intervening elements, can also be replaced by an indirect connection, i.e. a connection via one or more intervening elements, as long as this does not impair the basic function of the respective connection.

Figure 1:
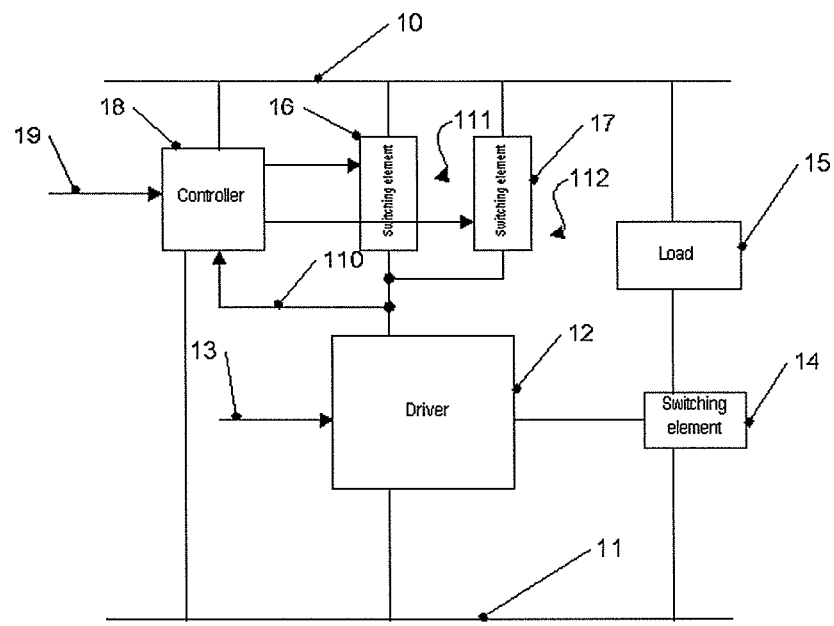
FIG. 1 shows a block diagram of a circuit in accordance with one example embodiment.

FIG. 1 illustrates a block diagram of a circuit in accordance with one example embodiment of the disclosure. The circuit in FIG. 1 comprises a driver 12, which drives a switching element 14, for example a switching transistor, in a manner dependent on an input signal 13. In this case, a driver is understood generally to mean a circuit which, in a manner dependent on an input signal, outputs a corresponding output signal, for example an amplified version of the input signal, a level-converted version of the input signal and/or an inverted version of the input signal.

The switching element 14 is connected in series with a load 15 between a first supply voltage potential 10, for example a positive supply voltage, and a second supply voltage potential 11, for example a negative supply voltage or ground. In a manner dependent on a switching state of the switching element 14 and thus in a manner dependent on the input signal 13, the load 15 is thus supplied with voltage and/or current via the first supply voltage potential 10 and the second supply voltage potential 11.

The driver 12 is likewise supplied with voltage and/or current by the first supply voltage potential 10 and the second supply voltage potential 11. By way of example, in the case of the example embodiment in FIG. 1, the driver 12 has a first supply terminal, which is connected to the first supply voltage potential 10 via a first current path 111 and via a second current path 112. A second supply voltage terminal of the driver 12 is connected to the second supply voltage potential 11, as illustrated.

The second current path 112 comprises a switching element 17, via which a current flow through the second current path 112 can be regulated, in particular the second current path 112 can be deactivated, such that no current flows via the second current path 112. Optionally, the first current path 111 can also have a switching element 16, via which current through the first current path 111 can be regulated and which can serve in particular for voltage regulation, as explained below. In the case of the example embodiment in FIG. 1, the switching elements 16 and 17 are driven via a controller 18. If only the switching element 17 is present, accordingly only this switching element is driven by a corresponding control circuit. In the case of the example embodiment illustrated, the controller 18 is likewise supplied via the first supply voltage potential 10 and the second supply voltage potential 11.

In one example embodiment, the second current path 112 is activated in a manner dependent on a current demand of the driver 12, for example if the current demand exceeds a predefined threshold value, and is deactivated if the current demand falls below the threshold value.

In addition, in some example embodiments, the controller 18, as indicated by an arrow 110, can monitor a voltage at the first supply input of the driver 12 and compare it with a reference voltage 19. Depending on the comparison, the controller 18 can then drive the switching elements 16 and/or 17 in order to regulate the voltage at the first supply input of the driver 12 to a desired value.

It should be noted that while the controller 18 is illustrated as a single block in FIG. 1, the functionalities described above can also be realized in different circuit sections. By way of example, the deactivation and activation of the second current path 112 can be performed wholly or partly by a different part of the circuit than the voltage regulation mentioned above.

As already mentioned, in some example embodiments, it is also possible to provide only an activation and deactivation of the second current path 112 without voltage regulation.

Figure 2:
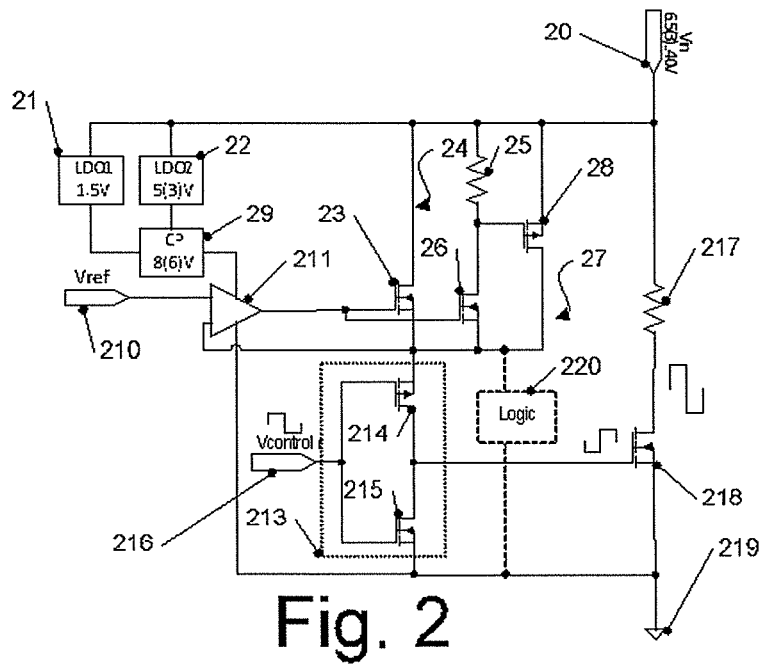
FIG. 2 shows a circuit diagram of a circuit in accordance with one example embodiment.

FIG. 2 illustrates a circuit diagram of a further example embodiment of the disclosure, wherein the circuit diagram in FIG. 2 shows implementation possibilities for elements of the example embodiment in FIG. 1.

In the case of the example embodiment in FIG. 2, a driver 213 comprises a PMOS transistor 214 and an NMOS transistor 215. Gate terminals of the transistors 214, 215 are connected to a control input 216, via which a control voltage $V_{control}$ can be fed in. An output of the driver 213 is connected to a gate terminal of an NMOS switching transistor 218, which serves as a switching element. The NMOS switching transistor 218 is connected with a load 217, which is represented by a resistor and which can be an arbitrary element to be supplied with current and/or voltage, for example a circuit, between a voltage supply terminal 20 and ground 219. A voltage $V_{in}$ is fed to the voltage supply terminal 20, which voltage can be between 6.5 volts and 40 volts for example in automotive applications, but can also be only 3 volts under some circumstances.

In order to supply the driver 213 with voltage, the driver 213 is coupled firstly to ground and secondly via a first current path 24, which is provided in particular for operation with a relatively low voltage $V_{in}$, and via a second current path 27, to the voltage supply terminal 20. The first current path 24 has an NMOS transistor 23 as switching element. A further path has an NMOS transistor 26 connected in series with a resistor 25. In addition, the second current path 27 having a PMOS transistor 28 is connected in parallel with the first current path 24 and the further path, as illustrated in FIG. 2, the gate terminal of the PMOS transistor 28 being connected to a node between the resistor 25 and the NMOS transistor 26.

Gate terminals of the NMOS transistors 23 and 26 are connected to an output of an operational amplifier 211. A first input of the operational amplifier 211 is connected to a reference voltage input 210, and a second input of the operational amplifier 211 is connected to a supply terminal of the driver 213, to which the first current path 24 and the second current path 27 are also connected. A first supply voltage terminal of the operational amplifier 211 is connected to the voltage supply terminal 20 via a charge pump 29 and voltage regulators 21, 22. The voltage regulators 21, 22 can be conFig.d, in particular, as voltage regulators having a low voltage drop (also designated as LDO from "Low Drop"). Via the operational amplifier 211, a supply voltage of the driver 213 can thus be regulated to $V_{ref}$ or a value dependent thereon. By means of the charge pump, it is ensured in this case that gate voltages of the NMOS transistors 23 and 26 can be kept constant.

In the case of the example embodiment illustrated, the NMOS transistor 26 can be a scaled version of the NMOS transistor 23, for example a version reduced by a factor N.

If, in the case of the example embodiment in FIG. 2, a current through the PMOS transistor 214 of the driver 213 exceeds a predefined threshold value $I_{threshold}$ at which $I_{threshold}/(N+1) \times R_{act}$ becomes equal to the threshold voltage of the PMOS transistor 28, where $R_{act}$ is the resistance value of the resistor 25 and N is the scaling factor mentioned above, the PMOS transistor 28 is turned on and thus accepts part of the current. The resistor 25 together with the NMOS transistor 26 thus contributes to activating the second current path 27 when the current demand exceeds a predefined threshold value, and to deactivating it if the current demand falls below the threshold value.

In the case of such an example embodiment, it suffices for the NMOS transistor 23 to be dimensioned in such a way that it can conduct a current corresponding to the threshold current $I_{threshold}$, while a higher current demand can be covered by the PMOS transistor 28. This can keep the requirements made of the charge pump 29 low in some example embodiments.

In the example embodiment in FIG. 2, it is therefore the case that a voltage value at the supply terminal of the driver 213 is kept at a predefined static value by means of the operation amplifier 211, while the dynamic reaction particularly in the case of fast switching processes can be improved by the second current path 27. In the example embodiment illustrated, the driver 213 has a high current driver capability, which leads to a low output impedance of a supply voltage of the driver (voltage between the transistors 23 and 214 FIG. 2). This in turn makes possible firstly fast switching processes of the switching transistor 218, which, particularly in the case of a high inductive load 217, e.g. in the case of DC/DC voltage converters, helps to keep down losses and influencing of other circuit sections. Secondly, fluctuations of the supply voltage of the driver during such switching processes can be avoided or reduced. This can be advantageous particularly in the case of example embodiments in which, in addition to the driver 213, other circuit elements, e.g. a logic circuit 220, e.g. logic gates, are connected in parallel with the driver 213 and are thus likewise affected by the fluctuations of the supply voltage of the driver. In addition, the requirements made of the various components are relatively low in the case of the example illustrated.

It should be noted that the circuit diagram in FIG. 2 merely serves as an example, and, in particular, the various components in FIG. 1 can also be implemented in a different manner than that illustrated in FIG. 2. By way of example, transistors other than PMOS and NMOS transistors can also be used as respective switching elements.

Figure 3:
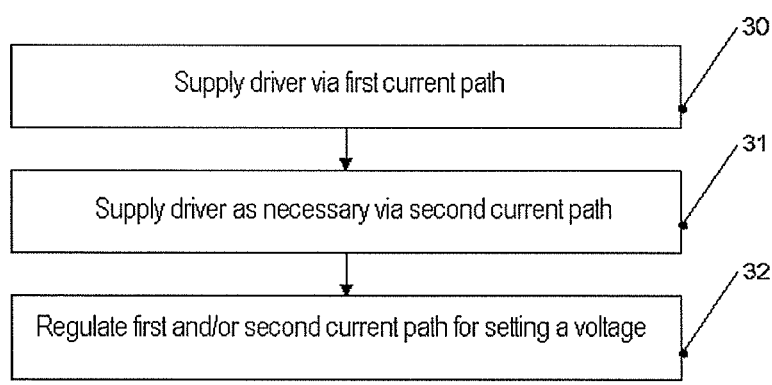
FIG. 3 shows a flow chart of a method in accordance with one example embodiment.

FIG. 3 illustrates a flow chart for elucidating a method in accordance with one example embodiment. The example embodiment in FIG. 3 can be implemented for example in the circuits in FIGS. 1 and 2, but can also be used independently thereof.

While the method in FIG. 3 is illustrated as a sequence of a plurality of steps 30-32, it should be noted that the different steps can also be carried out simultaneously with one another or else in a different order than that illustrated.

In 30, a driver is supplied with current via a first current path. In 31, the driver is supplied as necessary, for example if the current through the driver reaches a predefined threshold current, via a second current path. In addition, the first and/or the second current path can be regulated for setting a desired voltage at the driver in 32.

As already explained, the above example embodiments should be regarded merely as examples of possibilities for implementing the disclosure, and should not be interpreted as restrictive.

What is claimed is:

1. A circuit, comprising:
a driver having an input, an output, a first supply terminal and a second supply terminal;
a first current path, comprising a further switching element, between a first supply voltage potential and the first supply terminal of the driver;
a second current path between the first supply terminal of the driver and the first supply voltage potential, wherein the second current path comprises a switching element configured to selectively activate and deactivate the second current path, and wherein the second supply terminal of the driver is coupled to a second supply voltage potential; and
a controller, comprising a series circuit formed by a resistor and a scaled switching element, configured to drive the switching element to activate the second current path in response to a current through the driver reaching a predefined threshold value;
wherein the series circuit is connected in parallel with the second current path, and the scaled switching element is a scaled version of the further switching element, and
wherein a control terminal of the switching element is coupled to a node between the resistor and the scaled switching element.

2. The circuit as claimed in claim 1, wherein the controller is further configured to drive the switching element to deactivate the second current path in response to the current through the driver falls below the predefined threshold value.

3. The circuit as claimed in claim 1, wherein the switching element comprises a P-type transistor, and wherein the further switching element and the scaled switching element comprise N-type transistors.

4. The circuit as claimed in claim 1, further comprising a load switching element, wherein a control input of the load switching element is coupled to the output of the driver, and wherein the load switching element is connected in series with a load between the first supply voltage potential and the second supply voltage potential.

5. The circuit of claim 1, wherein the driver circuit is configured to receive an input signal and output an output drive signal in response thereto, wherein the driver circuit further receives a supply signal at the first supply terminal thereof;
wherein the switching element is configured to switch a load based on the output drive signal of the driver circuit; and
further comprising a variable current path circuit configured to vary a supply current to the first supply terminal of the driver circuit as a function of the current through the driver circuit.

6. The circuit as claimed in claim 5, wherein the variable current path circuit comprises:
the first current path configured to provide a regulated first current to the first supply terminal of the driver circuit; and
the second current path configured to provide a regulated second current to the first supply terminal of the driver circuit.

7. The circuit as claimed in claim 6, wherein the controller is configured to regulate the first current based on a voltage at the first supply terminal of the driver circuit, thereby providing a voltage regulation thereat.

8. The circuit as claimed in claim 6, wherein the controller is configured to ascertain a current demand of the driver circuit and vary the second current in response thereto.

9. The circuit as claimed in claim 8, wherein the controller is configured to deactivate the second current path in response to the current demand falling below the predetermined threshold value.

10. The circuit as claimed in claim 9, wherein the controller comprises a difference amplifier configured to drive the first current path and the second current path based on a difference between a voltage at the first supply terminal of the driver circuit and a reference voltage.

11. A circuit, comprising:
a driver having an input, an output, a first supply terminal and a second supply terminal;
a first current path between a first supply voltage potential and the first supply terminal of the driver, wherein the first current path comprises a further switching element;
a second current path between the first supply terminal of the driver and the first supply voltage potential, wherein the second current path comprises a switching element configured to selectively activate and deactivate the second current path, and wherein the second supply terminal of the driver is coupled to a second supply voltage potential; and
a controller, comprising an operational amplifier, configured to drive the switching element to activate the second current path in response to a current through the driver reaching a predefined threshold value and drive the further switching element based on a voltage at the first supply terminal of the drive and a reference voltage;
wherein a supply input of the operational amplifier is coupled to the first supply voltage potential via a charge pump.

12. A circuit, comprising:
a driver having an input, an output, a first supply terminal and a second supply terminal;
a first current path between a first supply voltage potential and the first supply terminal of the driver;
a second current path between the first supply terminal of the driver and the first supply voltage potential, wherein the second current path comprises a switching element configured to selectively activate and deactivate the second current path, and wherein the second supply terminal of the driver is coupled to a second supply voltage potential; and
a controller configured to drive the switching element to activate the second current path in response to a current through the driver reaching a predefined threshold value:
wherein the first current path comprises a first N-type transistor,
wherein the switching element comprises a P-type transistor,
further comprising a series circuit formed by a resistor and a further N-type transistor, wherein a gate terminal of the P-type transistor is coupled to a node between the resistor and the further N-type transistor,
wherein a gate terminal of the N-type transistor and a gate terminal of the further N-type transistor are coupled to an output of an operational amplifier,
wherein a first input of the operational amplifier is coupled to a reference voltage input, and
wherein a second input of the operational amplifier is coupled to the first supply terminal of the driver.

* * * * *